(12) United States Patent
Liu et al.

(10) Patent No.: US 10,916,511 B1
(45) Date of Patent: Feb. 9, 2021

(54) METHOD FOR REDUCING WARPAGE OCCURRED TO SUBSTRATE STRIP AFTER MOLDING PROCESS

(71) Applicant: KINGPAK Technology Inc., Hsinchu County (TW)

(72) Inventors: Fu-Chou Liu, Hsinchu County (TW); Chien-Chen Lee, Hsinchu County (TW); Ya-Han Chang, Hsinchu County (TW)

(73) Assignee: KINGPAK TECHNOLOGY INC., Zhubei (TW)

( * ) Notice: Subject to any disclaimer, the term of this patent is extended or adjusted under 35 U.S.C. 154(b) by 0 days.

(21) Appl. No.: 16/784,299

(22) Filed: Feb. 7, 2020

(30) Foreign Application Priority Data

Nov. 1, 2019 (TW) .............................. 108139820 A (51) Int. Cl.
*H01L 23/00* (2006.01)

(52) U.S. Cl.
CPC .. *H01L 23/562* (2013.01); *H01L 2224/32225* (2013.01); *H01L 2924/3511* (2013.01)

(58) Field of Classification Search
None
See application file for complete search history.

(56) References Cited

U.S. PATENT DOCUMENTS

| 2005/0136567 | A1 | 6/2005 | Chopin et al. |
| 2009/0081831 | A1* | 3/2009 | Yuan ...................... H01L 24/97 438/127 |
| 2018/0114705 | A1* | 4/2018 | Lin ....................... H01L 21/565 |

\* cited by examiner

*Primary Examiner* — Bo B Jang
(74) *Attorney, Agent, or Firm* — McClure, Qualey & Rodack, LLP (57) ABSTRACT

A method for reducing warpage occurred to a substrate strip after a molding process is provided. First, several dies are mounted on a top surface of a substrate strip. Then, a base having a top surface with a surface curvature is provided, and the top surface of the base is contacted against a bottom surface of the substrate strip to bend the substrate strip. Next, under the status that the top surface of the base is contacted against the bottom surface of the substrate strip, a molding compound is wrapped around each die. Finally, the molding compound is cooled to a room temperature. Accordingly, the molding process is performed on the substrate strip reversely bent in a direction opposite to a warpage direction. Therefore, the warpage originally caused by the molding process is offset by the reverse bending.

6 Claims, 7 Drawing Sheets

FIG. 1

(Prior Art)

FIG. 2

(Prior Art)

FIG. 3

(Prior Art)

METHOD FOR REDUCING WARPAGE OCCURRED TO SUBSTRATE STRIP AFTER MOLDING PROCESS

CROSS-REFERENCE TO RELATED APPLICATION

This non-provisional application claims priority under 35 U.S.C. § 119(a) to Patent Application No. 108139820 filed in Taiwan, R.O.C. on Nov. 1, 2019, the entire contents of which are hereby incorporated by reference.

BACKGROUND

Technical Field

The disclosure relates to a method for reducing warpage occurred to a substrate strip after a molding process.

Related Art

In a conventional molding process performed on an integrated circuit chip, dies are extracted one by one from a device wafer where a die cutting step has been completed, and then the dies are one by one bonded to a substrate or a lead frame. Then, an I/O junction on the chip is electrically connected to a corresponding metal pin on the lead frame in a manner of wire bonding. Finally, the substrate/lead frame carrying the chip is sent to a press molding machine. After a molding compound is heated and softened by using the press molding machine, the molding compound is wrapped on surfaces of the dies, so as to protect the fragile chip from outside moisture and air.

Figure 1:
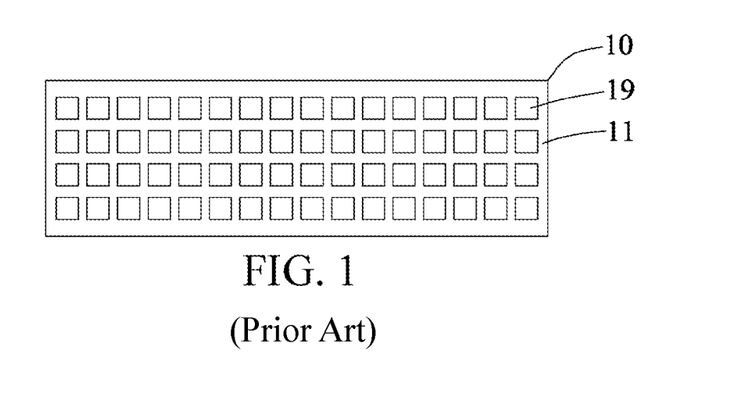
FIG. 1 is a schematic diagram (1) of a conventional molding process.
Figure 2:
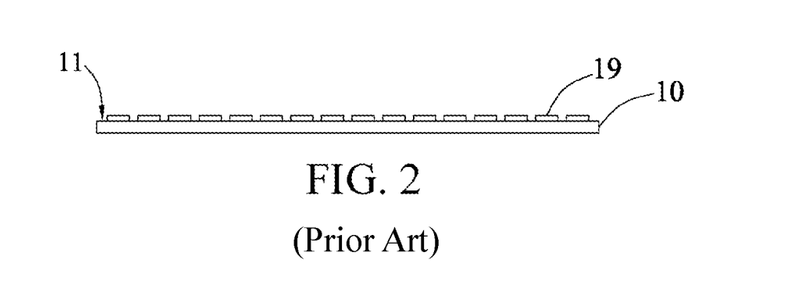
FIG. 2 is a schematic diagram (2) of the conventional molding process.
Figure 3:
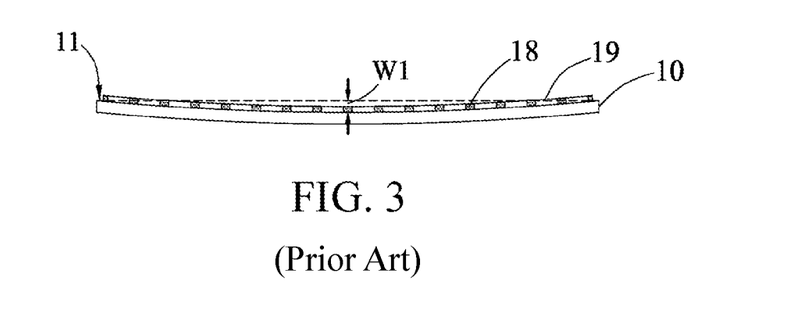
FIG. 3 is a schematic diagram (3) of the conventional molding process.
Figure 4:
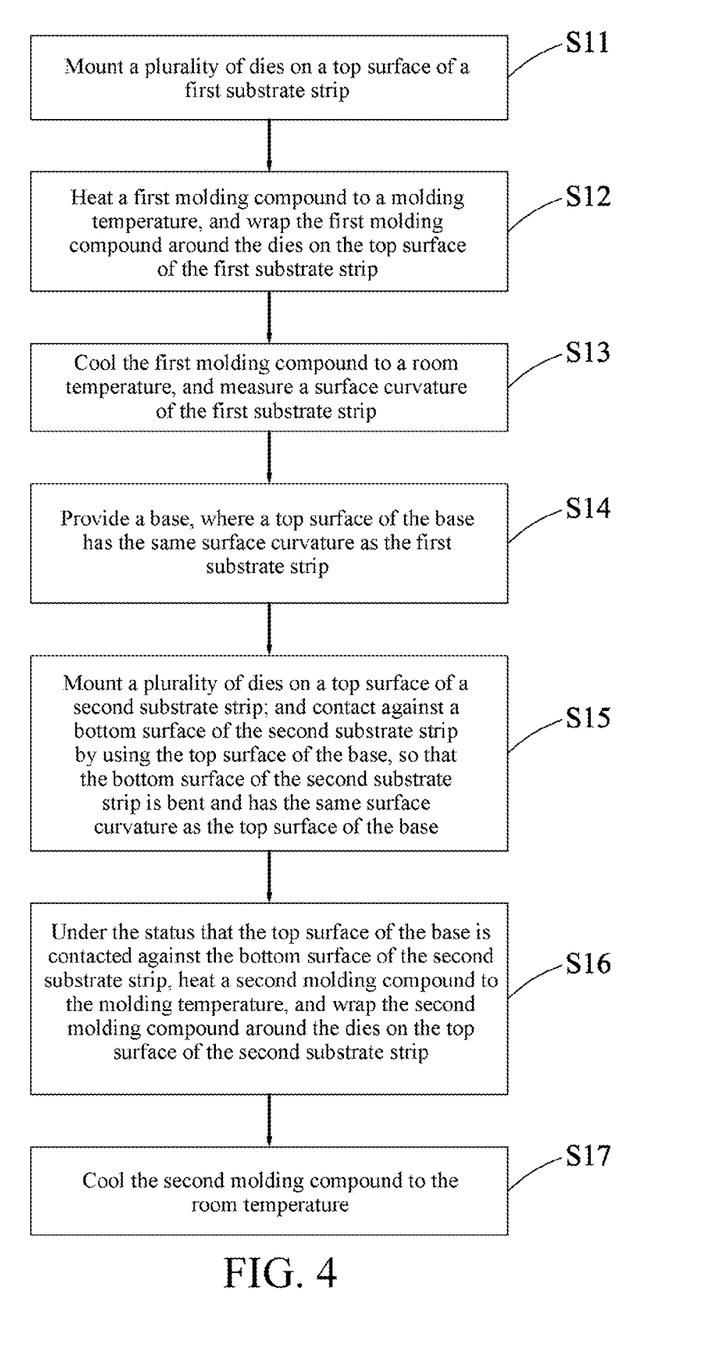
FIG. 4 is a flowchart of a first embodiment of a method for reducing warpage occurred to a substrate strip after a molding process according to the disclosure.

However, as the dies have been bonded to a substrate, particularly a substrate strip including organic ingredients, warpage is often found occurring to the entire substrate strip after the molding process is completed in practice. As shown in FIG. 1 and FIG. 3, after the molding process, a conventional substrate strip 10 will not be as flat as that shown in FIG. 2, but shall be just like what is shown in FIG. 3, the substrate strip 10 is bent from two ends of the length direction and has warpage. A warping degree can be indicated by a difference between a highest point and a lowest point on a surface. As shown in FIG. 3, a difference between a highest point and a lowest point on a top surface 11 of the substrate strip 10 is W1. In this case, it can be said that the substrate strip 10 has the warping degree of W1.

The warping degree varies with a size of the substrate strip 10 and distribution of dies 19 on the top surface 11. FIG. 1 shows a substrate strip 10 currently used for chip encapsulation of a CMOS image sensor, with a length of about 174 mm and a width of about 54 mm. The dies 19 on the top surface 11 of the substrate strip 10 are arranged in a 16*4 matrix. After the molding process, the warping degree W1 of the substrate strip 10 falls in a range of 15.5 mm to 17.5 mm.

SUMMARY

In view of this, the disclosure provides a method for reducing warpage occurred to a substrate strip after a molding process, including the following steps: mounting a plurality of dies on a top surface of a first substrate strip; heating a first molding compound to a molding temperature, and wrapping the first molding compound around each of the dies on the top surface of the first substrate strip; cooling the first molding compound to a room temperature, and measuring a surface curvature of the first substrate strip; providing a base, where a top surface of the base has the same surface curvature as the first substrate strip; mounting a plurality of dies on a top surface of a second substrate strip; enabling the top surface of the base to contact against a bottom surface of the second substrate strip, so that the bottom surface of the second substrate strip is bent and has the same surface curvature as the top surface of the base; under the status that the top surface of the base is contacted against the bottom surface of the second substrate strip, heating a second molding compound to the molding temperature, and wrapping the second molding compound around each of the dies on the top surface of the second substrate strip; and cooling the second molding compound to the room temperature.

The disclosure further provides a method for reducing warpage occurred to a substrate strip after a molding process, including the following steps: mounting a plurality of dies on a top surface of a substrate strip; providing a base, where a top surface of the base has a surface curvature; enabling the top surface of the base to contact against a bottom surface of the substrate strip, so that the bottom surface of the substrate strip is bent and has the same surface curvature as the top surface of the base; under the status that the top surface of the base is contacted against the bottom surface of the substrate strip, heating a molding compound to a molding temperature, and wrapping the molding compound around each of the dies on the top surface of the substrate strip; and cooling the molding compound to the room temperature.

DETAILED DESCRIPTION

In the following embodiments, "up" or "down" is used only to describe a position shown in the figures, and an actual position is not limited thereto.

After analyzing the warpage described in the prior art, it is deduced that there are three causes: One is that a molding compound is a high polymer material and shrinks in a curing process, and therefore the molding compound applies a shrinkage stress to a substrate strip 10 along a top surface 11 of the substrate strip 10; the second is that the substrate strip 10 includes organic ingredients, and the organic ingredients also undergo a period of continuous high temperature due to a molding process and then harden and shrink; and the third is that thermal expansion coefficients of the molding compound and the substrate strip are different. Under the action of the above three effects, the warpage is occurred to the substrate strip 10 after the molding process. The warpage considerably causes trouble to the subsequent manufacturing process. In view of this, the disclosure provides a method for reducing warpage occurred to a substrate strip after a molding process, which is described as follows in embodiments.

First Embodiment

FIG. 4 to FIG. 10 are respectively a flowchart and schematic diagrams (1) to (6) of a first embodiment of a method for reducing warpage occurred to a substrate strip after a molding process according to the disclosure. The schematic diagrams (1) to (6) are used to help describe steps S11 to S17 in the flowchart.

Figure 5:
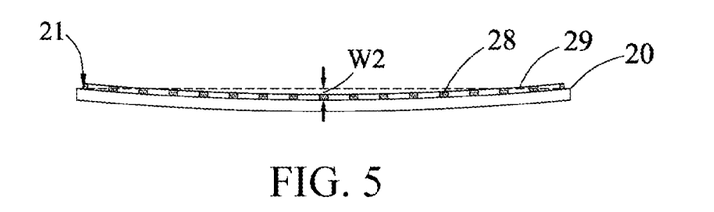
FIG. 5 is a schematic diagram (1) of the first embodiment of the method for reducing warpage occurred to a substrate strip after a molding process according to the disclosure.

In terms of different types of chips, different substrate strips will be used for the molding process, and different substrate strips will have different warping degrees after the molding process. Therefore, in order to implement the method of the embodiment, it needs to evaluate the extent of potential warping of a to-be-molded product after the molding process through experiments. As shown in FIG. 5, first, a plurality of dies 29 are mounted on a top surface 21 of a first substrate strip 20. The dies 29 may be dummy dies without a circuit layout. Then, the first substrate strip 20 is sent into a press molding device (not shown in the figure). The first molding compound is heated to a molding temperature (for example, 170° C. to 180° C.) by using the press molding device, and the first molding compound is evenly wrapped around each of the dies 29 on the top surface 21 of the first substrate strip 20 and then is cooled to a room temperature (20° C. to 25° C.). In this case, it is found that two sides of the first substrate strip 20 are bent upward, so that the top surface 21 has a surface curvature. The surface curvature enables the first substrate strip 20 to have a warping degree W2 (a difference between a highest point and a lowest point of the top surface 21). In this embodiment, a length of the first substrate strip 20 is about 174 mm, and a width is about 54 mm. The dies 29 on the top surface 21 of the first substrate strip 20 are arranged in a 16*4 matrix. According to experimental statistics, it can be concluded that the first substrate strip 20 has different surface curvatures after the molding process, and the warping degrees W2 corresponding to different surface curvatures fall in a range of 16.0 mm to 17.0 mm. Therefore, a median 16.5 mm may be used as a target value of the warping degree to be reduced.

Figure 6:
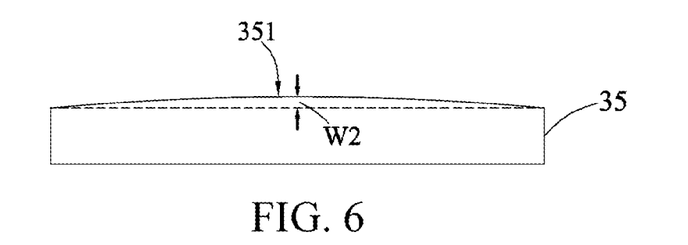
FIG. 6 is a schematic diagram (2) of the first embodiment of the method for reducing warpage occurred to a substrate strip after a molding process according to the disclosure.

As shown in FIG. 6, after the warping degree resulted from the molding process is evaluated as 16.5 mm, a base 35 may be produced to carry a second substrate strip 30 in the subsequent molding process. The surface curvature of a top surface 351 of the base 35 is equivalent to that of the top surface 21 of the first substrate strip 20 with a 16.5 mm warping degree. A distinction is that the top surface 351 of the base 35 is convex and the top surface 21 of the first substrate strip 20 is concave.

Figure 7:
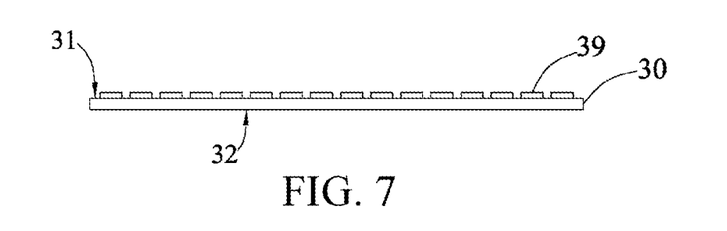
FIG. 7 is a schematic diagram (3) of the first embodiment of the method for reducing warpage occurred to a substrate strip after a molding process according to the disclosure.
Figure 8:
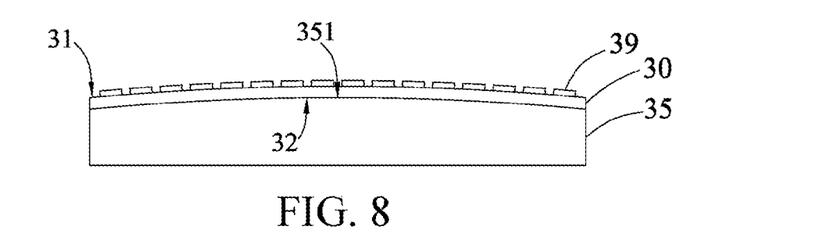
FIG. 8 is a schematic diagram (4) of the first embodiment of the method for reducing warpage occurred to a substrate strip after a molding process according to the disclosure.

As shown in FIG. 7, after the base 35 is produced, a plurality of product dies 39 may be mounted on a top surface 31 of a second substrate strip 30 (whose compositions are the same as the first substrate strip 20). Then as shown in FIG. 8, the top surface 351 of the base 35 is contacted against a bottom surface 32 of the second substrate strip 30, so that the bottom surface 32 of the second substrate strip 30 is bent and fits the top surface 351 of the base 35, thereby having the same surface curvature as the top surface 351 of the base 35. In some embodiments, the press molding device may be particularly designed to include pins for applying forces from top to bottom on two ends of the second substrate strip 30 along a length direction, so that the bottom surface 32 of the second substrate strip 30 fits the top surface 351 of the base 35.

Next, under the status that the top surface 351 of the base 35 is contacted against the bottom surface 32 of the second substrate strip 30, a second molding compound (whose compositions are the same as the first molding compound) is heated to the molding temperature (for example, 170° C. to 180° C.), and the second molding compound is evenly wrapped around the dies 39 on the top surface 31 of the second substrate strip 30.

Figure 9:
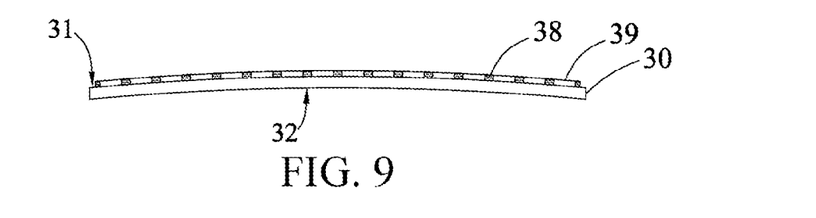
FIG. 9 is a schematic diagram (5) of the first embodiment of the method for reducing warpage occurred to a substrate strip after a molding process according to the disclosure.
Figure 10:
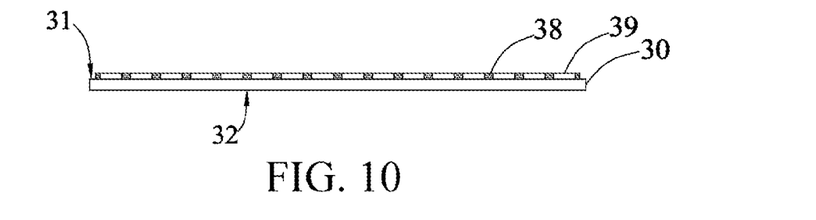
FIG. 10 is a schematic diagram (6) of the first embodiment of the method for reducing warpage occurred to a substrate strip after a molding process according to the disclosure.
Figure 11:
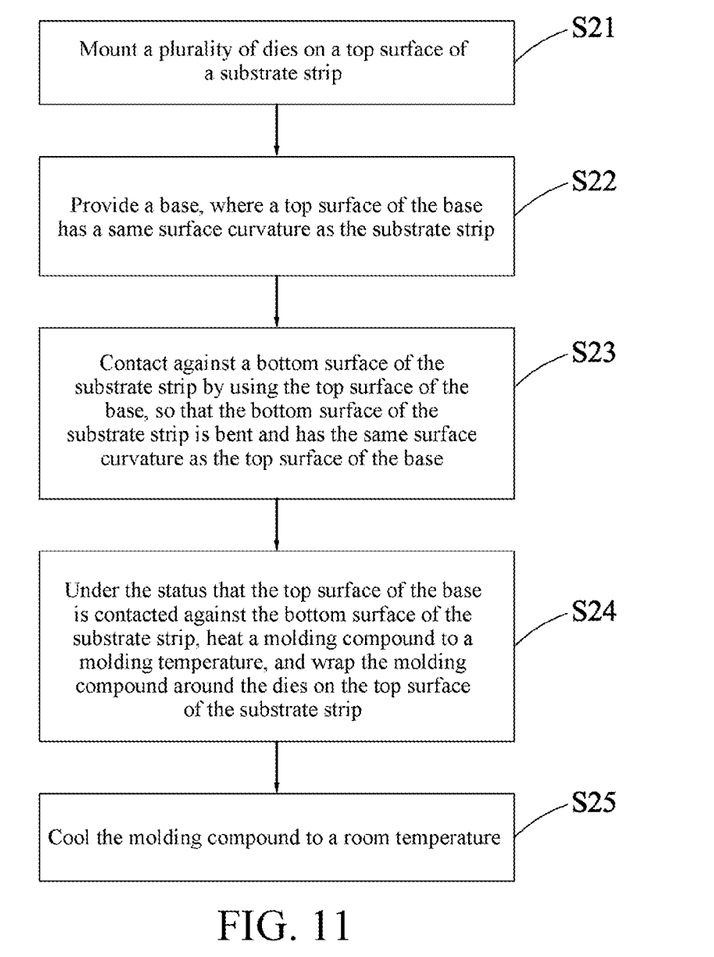
FIG. 11 is a flowchart of a second embodiment of a method for reducing warpage occurred to a substrate strip after a molding process according to the disclosure.

As shown in FIG. 9, when the second molding compound has been evenly wrapped around each of the dies 39 on the top surface 31 of the second substrate strip 30 and the temperature of the second molding compound is cooled from the molding temperature to an intermediate temperature from 50° C. to 100° C., the second substrate strip 30 may be taken out from the press molding device, so that the second substrate strip 30, in a free state, is cooled to the room temperature (20° C. to 25° C.) in the air. In this case, as shown in FIG. 10, it may be found that the warpage occurred to the second substrate strip 30 due to the molding process has been nearly eliminated or reduced to a negligible level.

The foregoing method for eliminating (or reducing) the warpage occurred to the second substrate strip 30 after the molding process focuses on that the molding process induces a contraction stress on the top surface 31 of the second substrate strip 30 to bend the second substrate strip 30 upward. Therefore, before the molding process, the second substrate strip 30 is bent toward an opposite direction by using the base 35, so that a tension stress whose magnitude is near to that of the contraction stress pre-exists on the top surface 31 of the second substrate strip 30. After the molding process is completed under the status that the top surface 31 of the second substrate strip 30 has the tension stress, the tension stress can offset the contraction stress resulted from the molding process, thereby eliminating (or reducing) the warpage possibly occurred to the second substrate strip 30.

It should be particularly noted that, the purpose of the taking the second substrate strip 30 out of the press molding device when the second molding compound is cooled to the intermediate temperature from 50° C. to 100° C. is to improve productivity. Temperature rise and temperature drop in a heat treatment process are time-consuming. When product performance is not affected, optimization of a temperature rise-drop curve in a production process can effectively improve productivity and avoid energy waste. By taking the second substrate strip 30 out of the press molding device when the second molding compound is cooled to the intermediate temperature, a cooling time of the second substrate strip 30 in the press molding device can be reduced, and a heating time of the molding process of a next substrate strip can also be reduced. Certainly, warpage of the second substrate strip 30 can also be eliminated (or reduced) by cooling the second substrate strip 30 to the room temperature in the press molding device (that is, under the status that the top surface 351 of the base 35 is contacted against the bottom surface 32 of the second substrate strip 30), regardless of productivity and energy costs.

Second Embodiment

FIG. 11 to FIG. 16 are respectively a flowchart and schematic diagrams (1) to (5) of a second embodiment of a method for reducing warpage occurred to a substrate strip after a molding process according to the disclosure. The schematic diagrams (1) to (5) are used to help describe steps S21 to S25 in the flowchart.

After a database of warping degrees occurred to the molding process of different product dies is established, experimental evaluations are not required when the method for eliminating (or reducing) the warpage is subsequently performed on the same product dies. The descriptions are as follows.

Figure 12:
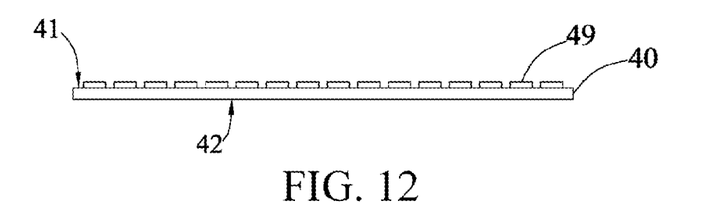
FIG. 12 is a schematic diagram (1) of the second embodiment of the method for reducing warpage occurred to a substrate strip after a molding process according to the disclosure.
Figure 13:
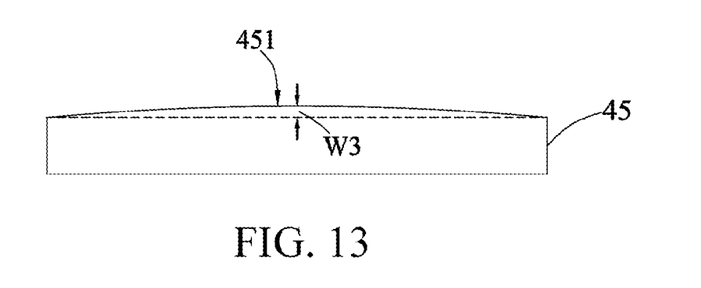
FIG. 13 is a schematic diagram (2) of the second embodiment of the method for reducing warpage occurred to a substrate strip after a molding process according to the disclosure.

As shown in FIG. 12, first, a plurality of product dies 49 are mounted on a top surface 41 of a substrate strip 40. Next, as shown in FIG. 13, according to the database, the warping degree occurred to a substrate strip 40 with the dies 49 after a molding process can be looked up. Then, a base 45 is processed according to the queried data to enable a top surface 451 of the base 45 to have a specific surface curvature. The surface curvature of the top surface 451 of the base 45 is equivalent to that of the top surface 41 of the substrate strip 40 due to the warpage after the molding process. A distinction is that the top surface 451 of the base 45 is convex and the top surface 41 of the warped substrate strip 40 is concave.

Figure 14:
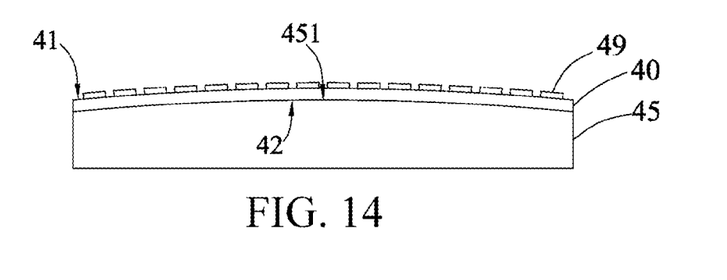
FIG. 14 is a schematic diagram (3) of the second embodiment of the method for reducing warpage occurred to a substrate strip after a molding process according to the disclosure.
Figure 15:
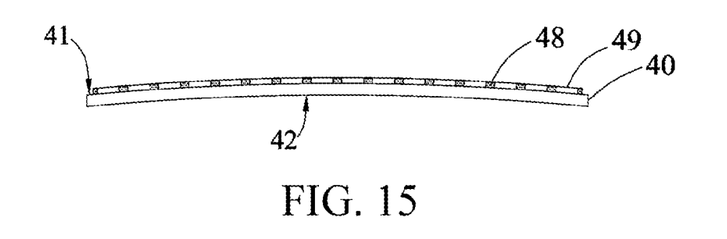
FIG. 15 is a schematic diagram (4) of the second embodiment of the method for reducing warpage occurred to a substrate strip after a molding process according to the disclosure.
Figure 16:
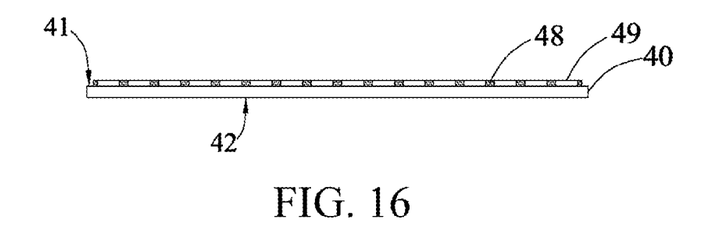
FIG. 16 is a schematic diagram (5) of the second embodiment of the method for reducing warpage occurred to a substrate strip after a molding process according to the disclosure.

Next, as shown in FIG. 14, the top surface 451 of the base 45 is contacted against a bottom surface 42 of the substrate strip 40, so that the bottom surface 42 of the second substrate strip 40 is bent and fits the top surface 451 of the base 45, thereby having the same surface curvature as the top surface 451 of the base 45. Similarly, in some embodiments, the press molding device may be particularly designed to include pins for applying forces from top to bottom on the substrate strip 40, so that the bottom surface 42 of the substrate strip 40 fits the top surface 451 of the base 45. Next, under the status that the top surface 451 of the base 45 is contacted against the bottom surface 42 of the substrate strip 40, a second molding compound is heated to a corresponding molding temperature (for example, the foregoing 170° C. to 180° C.), and the molding compound is evenly wrapped around each of the dies 49 on the top surface 41 of the substrate strip 40. Then, as shown in FIG. 15, the substrate strip 40 is taken out when the substrate strip 40 is cooled to an intermediate temperature from 50° C. to 100° C. to be cooled to a room temperature (20° C. to 25° C.). In this case, as shown in FIG. 16, the warpage possibly occurred to the substrate strip 40 due to the molding process has been eliminated or reduced to a negligible level. The principle of reducing the warpage is the same as the descriptions in the foregoing embodiment, and is not described herein again.

It should be particularly noted that, for ease of describing steps of the method for reducing warpage occurred to a substrate strip after a molding process of the disclosure, thicknesses and sizes of the elements are not exactly depicted according to actual scales in the accompanying drawings of the disclosure.

Although the disclosure has been described in considerable detail with reference to certain preferred embodiments thereof, the disclosure is not for limiting the scope of the disclosure. Persons having ordinary skill in the art may make various modifications and changes without departing from the scope and spirit of the disclosure. Therefore, the scope of the appended claims should not be limited to the description of the preferred embodiments described above.

What is claimed is:

1. A method for reducing warpage occurred to a substrate strip after a molding process, comprising:
   mounting a plurality of dies on a top surface of a first substrate strip;
   heating a first molding compound to a molding temperature, and wrapping the first molding compound around each of the dies on the top surface of the first substrate strip;
   cooling the first molding compound to a room temperature, and measuring a surface curvature of the first substrate strip;
   providing a base, wherein a top surface of the base has the surface curvature;
   mounting a plurality of dies on a top surface of a second substrate strip;
   enabling the top surface of the base to contact against a bottom surface of the second substrate strip, so that the bottom surface of the second substrate strip is bent and has the surface curvature;
   under a state that the top surface of the base is contacted against the bottom surface of the second substrate strip, heating a second molding compound to the molding temperature, and wrapping each of the dies on the top surface of the second substrate strip with the second molding compound; and
   cooling the second molding compound to the room temperature.

2. The method according to claim 1, wherein the second molding compound is cooled to the room temperature under the state that the top surface of the base is contacted against the bottom surface of the second substrate strip.

3. The method according to claim 1, wherein the second molding compound is cooled to an intermediate temperature under the state that the top surface of the base is contacted against the bottom surface of the second substrate strip, and then the second molding compound is cooled to the room temperature after removal of the second substrate strip from a press molding device.

4. The method according to claim 3, wherein the intermediate temperature is not lower than 50° C.

5. The method according to claim 1, wherein the first substrate strip and the second substrate strip are rectangular, lengths of the first and second substrate strips are in a range of 165 mm to 180 mm, and widths of the first and second substrate strips are in a range of 50 mm to 60 mm.

6. The method according to claim 1, wherein the molding temperature is in a range of 170° C. to 180° C.

* * * * *